United States Patent [19]

Schulmann et al.

[11] Patent Number: 5,702,523
[45] Date of Patent: Dec. 30, 1997

[54] ROTATING HEAD FOR CRYSTAL PULLING SYSTEMS

[75] Inventors: Winfried Schulmann, Kleinostheim; Franz Thimm, Alzenau; Helmut Kaiser, Bruchköbel, all of Germany

[73] Assignee: Leybold Aktiengesellschaft, Hanau Am Main, Germany

[21] Appl. No.: 302,194

[22] Filed: Aug. 31, 1994

[30] Foreign Application Priority Data

Aug. 31, 1993 [DE] Germany .................. P 43 29 283.6

[51] Int. Cl.⁶ .................................................. C30B 35/00
[52] U.S. Cl. ........................ 117/208; 117/200; 117/218
[58] Field of Search .................................. 117/200, 208, 117/212, 216, 218; 127/15, 16, 17

[56] References Cited

U.S. PATENT DOCUMENTS

| 4,367,199 | 1/1983 | Jericho .................. | 117/218 |
| 4,394,352 | 7/1983 | Helga et al. ............. | 117/208 |
| 4,663,128 | 5/1987 | Helgeland ................ | 117/218 |

FOREIGN PATENT DOCUMENTS

| 0437775 | 7/1991 | European Pat. Off. . |
| 3119916 | 6/1982 | Germany . |

*Primary Examiner*—Richard Bueker
*Assistant Examiner*—Felisa C. Garrett
*Attorney, Agent, or Firm*—Felfe & Lynch

[57] ABSTRACT

A rotating head (11) for crystal pulling systems (1) according to Czochralski has a reference platform (16) which is able to rotate around a vertical rotation axis (A—A) with a vertical feed-through opening (25) for a pulling cable (13) that can be wound up and a drive assembly (23) for driving a horizontal shaft (22). A winding drum (15) with a helical winding groove (29) for the pulling cable is located on this shaft in a fixed manner so it cannot rotate, but can be moved axially. In order to avoid abrasion and contamination and to accurately guide the cable (13), a helical guiding element (30) with the same pitch as the winding groove is located on the horizontal shaft (22) at a location remote from the vertical rotation axis (A—A). This guiding element is able to rotate with the horizontal shaft. The guiding element works together with a guiding nut (31) in such a way that the part of the cable (13) which faces tangentially away from the winding drum (15) is directly guided in the vertical rotation axis (A—A). Here, the helical guiding element (30) is designed as a guiding groove and the guiding nut (31) cooperates with the guiding groove by means of rotating balls (32).

5 Claims, 3 Drawing Sheets

1

ROTATING HEAD FOR CRYSTAL PULLING SYSTEMS

BACKGROUND OF THE INVENTION

The invention relates to a rotating head for crystal pulling systems for carrying out the Czochralski process with a reference platform rotating around a vertical rotation axis, and a vertical feed-through opening for a pulling member, especially a cable, that can be wound up along the rotation axis. A drive assembly is located on this reference platform in order to drive a horizontal shaft; a winding drum is located on this shaft in a manner that prevents it from rotating relative to the shaft but allows it to be moved axially relative to the shaft. This winding drum has a helical winding groove for purposes of receiving the pulling member. A guiding mechanism that causes the axial displacement of the winding drum consists of a helical guiding element that rotates with the horizontal shaft and has the same pitch as the winding groove, and a guiding nut at a location that is removed from the vertical rotation axis.

Such cable rotating heads serve the purpose of pulling a crystal that was formed according to the Czochralski method from the molten mass located in a melting pot/crucible and during this process, to overlay a rotating movement around its longitudinal axis on the pulled crystal at the same time. A compulsory requirement for this is that the lifting as well as the rotation motion of the crystal be carried out as steadily as possible, in particular without any sudden jerks. Since the same pressure is normally present in the rotating head as well as in the crystal pulling system, but no substances that are able to condense should migrate from the crystal pulling system into the rotating head, the design of the feed-through opening in the reference platform is relatively narrow. The pulling member must be guided inside the feed-through opening in a coaxial manner as much as possible. Since the pulling member is rolled up on the winding drum in a helical pattern, the winding drum must be subsequently guided in the direction of its longitudinal axis in such a manner that the axis of the winding member always coincides with the axis of the feed-through opening. In the vicinity of the winding drum, the pulling member follows a path that is essentially tangential to the surface of the winding drum.

With the known rotating heads (e.g. according to DE 31 16 916), an axial subsequent guiding of the winding drum was brought about by the fact that either a concave guiding roller grips the pulling member and presses it into the winding groove or a convex guiding roller engages the winding groove in the vicinity of the pulling member. This, however, leads to undesirable abrasion which can be attributed to a condensate which forms on the surface of the pulling member, occasionally also on the surface of the winding drum. Primarily, however, the known solutions do not provide an operation that is largely jerk-free so that disturbances in the pulling process could be observed. The already mentioned abrasion material may fall through the feed-through opening in the reference platform into the molten mass located vertically underneath which results in a further deterioration of the pulling process, considering the extraordinarily high purity requirements of the pulled crystals.

EP-A 437 775 describes a cable rotating head equipped with a pull cable and a winding drum displaced through a threaded connection which has the same pitch as the winding groove of the winding drum. However, during the pulling process, i.e. during the wind-up phase, the cable is wound upwards from the feed-through opening and from there downwards in a tangential manner onto the winding drum through a fixed guide disk equipped with a guiding groove. The circumference of this guiding disk is constantly exposed to vapor condensation from the feed-through opening at the same location. The cable is pressed into the guiding groove of the guiding disk by means of guiding pins or a pressure roller whereby abrasion material is released from the cable as well as from the guiding disk toward below in the direction of the feed-through opening. Furthermore, the uneven abrasion of the cable results in a rough cable surface which counteracts an even pulling of the cable. The threaded connection for moving the winding drum is designed without a ball guide and with the conventional radial and axial play which also has a negative effect on the smooth running of the winding drum.

The term "reference platform" does not necessarily define a rotating circular disk, but very generally refers to a rotating plane on which the mechanical parts of the rotating head are located.

SUMMARY OF THE INVENTION

The invention is therefore based on the task of improving a rotating head of the earlier mentioned type so that the rotational and axial movements of the winding drum take place without jerky movements and, in particular, without creating any abrasion material in the area above the feed-through opening which could fall into the crystal pulling system through the mentioned feed-through opening.

According to the invention, the part of the pulling member that has been wound directly on the winding drum in a tangential manner is guided in the vertical rotation axis. The helical guiding element is designed as a guiding groove, and the guiding nut cooperates with the guiding groove by means of rotating balls.

The solution according to the invention results in a jerk-free and even guiding of the winding drum in horizontal direction. The formation of abrasion material is essentially suppressed, and there is no abrasion material whatsoever in the area of the vertical feed-through opening for the pulling member. The rotating head can be designed in an extremely compact manner with mostly standardized components, whereby a smaller number of parts are located in a vacuum than in the state of the art. Assembly is easier since the orientation of the pulling member toward the feed-through opening in the reference platform is practically automatic and in addition, operating safety is increased.

According to a first embodiment of the invention, the helical guide groove is located on the surface of an extension of the winding drum, and the guiding nut is fixed relative to the reference platform or even forms an integral part of a housing located on the reference platform. This housing contains the winding drum and its drive assembly.

According to a second embodiment of the invention, the helical guide groove is located on the surface of a horizontal shaft, and the guiding nut is located opposite the reference platform in a manner that does not allow for rotation, but that allows for axial movement with the winding drum. It is of particular significance that the helical guide groove cooperates with the guiding nut through rotating balls. The total arrangement therefore forms a type of "spindle revolving around balls" which operates in a manner that is particularly free of wear and tear and also jerk-free, and fulfills the set requirements entirely.

DETAILED DESCRIPTION OF THE PREFERRED EMBODIMENT

Figure 1:
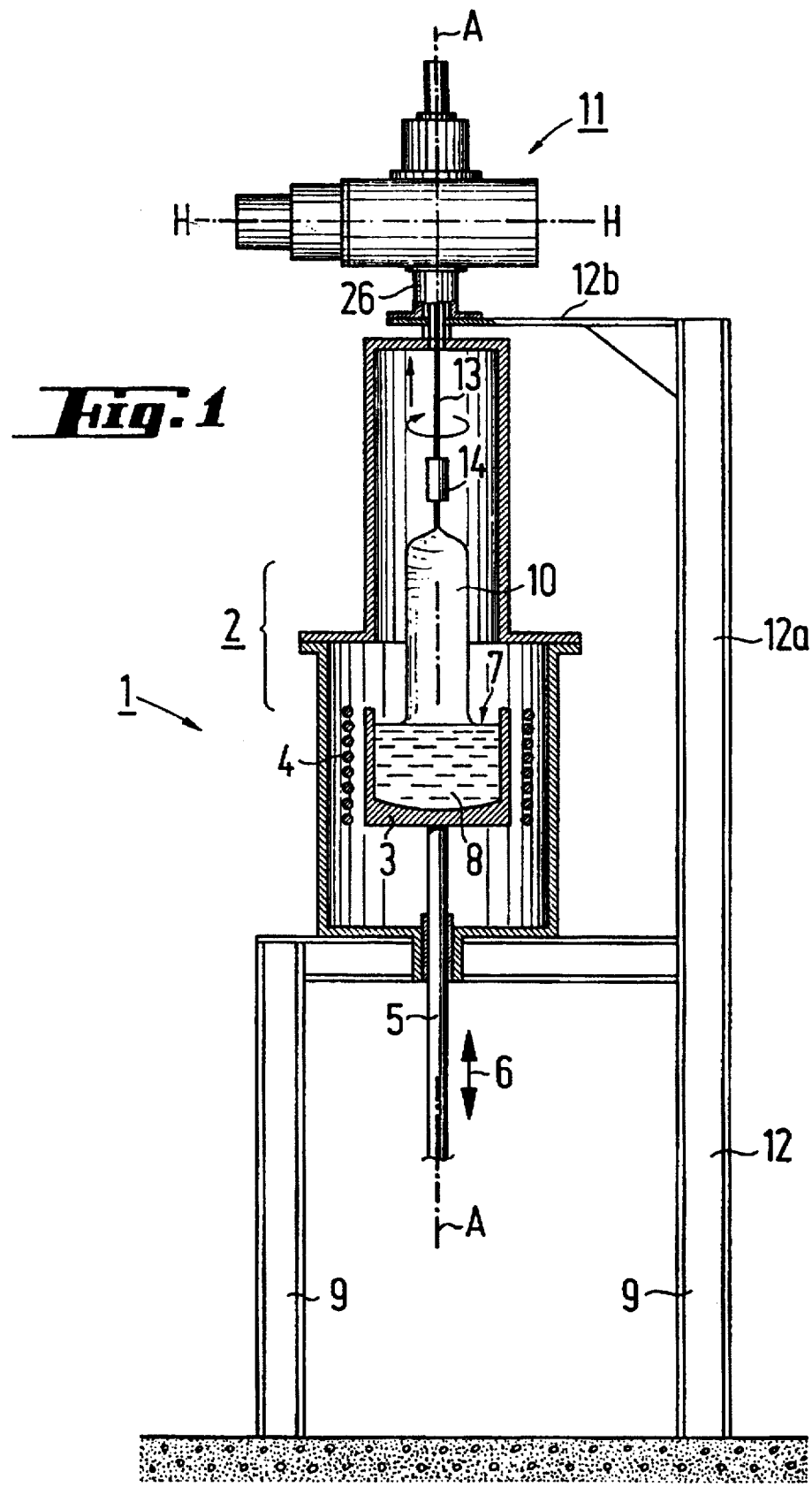
FIG. 1 is a partial vertical section along the rotation axis A—A through a crystal pulling system.

FIG. 1 shows a crystal pulling system for carrying out the process according to Czochralski in a vacuum chamber 2 which is connected to the vacuum pumps (not illustrated). Inside chamber 2, there is a crucible 3 which is surrounded by an inductance coil 4 through which the content of crucible 3 is melted and maintained at the temperature required for the pulling process. The crucible is connected by means of a lifting rod 5 to a vertical drive (not illustrated) by means of which the lifting rod 5 can be moved up and down in the direction of the double arrow 6. As a result of this, the surface 7 of the molten material 8 can be held at a constant height. Chamber 2 is located on a support frame 9.

From the molten material 9, a crystal 10 is pulled upwards at a controlled speed whereby this crystal is set into a rotating motion by means of a rotating head 11. The rotating head 11 will be explained in further detail by means of FIG. 2; it is mounted on an extension 12a of one of the supporting beams 12 of the supporting frame 9. From the rotating head 11, a flexible pulling member 13, which is designed as a cable in the present case, leads into the chamber 2. The mentioned crystal 10 is suspended from this pulling member 13 by means of a crystal seed holder 14. The description of further details is not necessary since—with the exception of rotating head 11—this type of crystal pulling system is state of the art.

Figure 2:
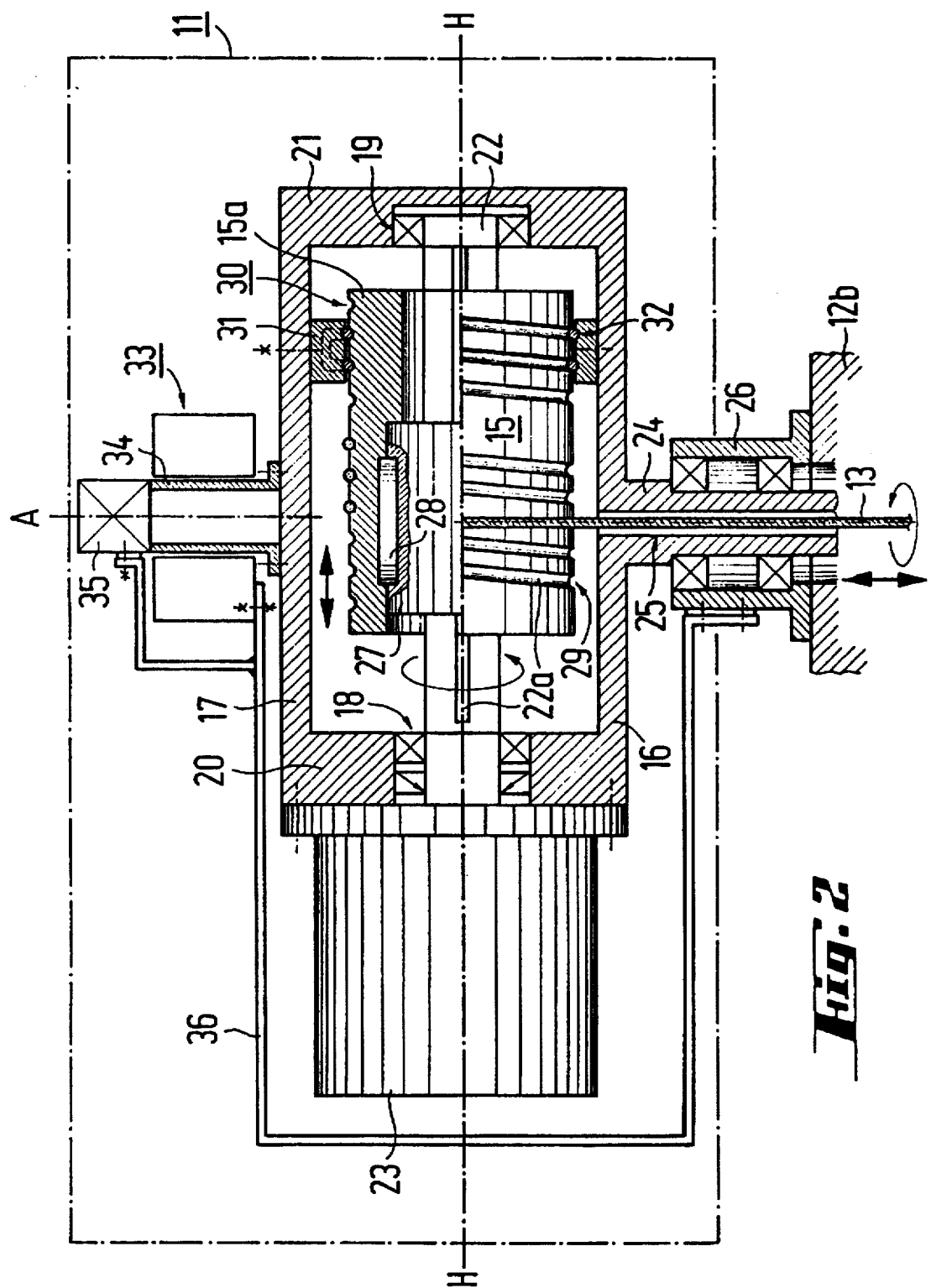
FIG. 2 is a partial section along the horizontal axis H—H through a first embodiment rotating head.

FIG. 2 shows the rotating head 11 with two partial sections along the vertical planes which are defined by the vertical rotation axis A—A and the horizontal axis H—H of a winding drum 15 for the pulling member 13. A reference platform 16 belongs to the rotating head 11, this reference platform is part of a mostly closed housing 17 which surrounds the winding drum 15 with a distance in between. Housing 17 has two bearing locations 18 and 19 in the frontal walls 20 and 21 of the housing 17. In these bearing locations 18 and 19, a horizontal shaft 22 is located which is driven at one of its ends by a drive assembly 23 of which reducing gear systems are part (not illustrated).

The reference platform 16 is equipped with a vertical hollow shaft 24 which defines the rotation axis A—A and has a feed-through opening 25 which is concentric to this axis, this feed-through opening also goes through the reference platform 16. The pulling member 13 is fed through this feed-through opening.

The hollow shaft 24 is positioned by means of two roller bearings in a bearing housing 26 which in turn is mounted on the extension 12b of the support beam 12 shown in FIG. 1. The bearing housing 26 is sealed off toward the hollow shaft 24 and also connected in a gastight manner with the chamber 2. Furthermore, housing 17 is also designed in a gastight manner so that the same pressure as in chamber 2 can be obtained by means of the feed-through opening 25 in housing 17.

The horizontal shaft 22 has a wedge 22a along its circumference which serves to guide the winding drum 15 axially without rotating relative to the shaft. For this purpose, the winding drum 15 is guided by means of an inserted ball bearing 27 on shaft 22 in a manner which allows for axial movement. Further details of this guide mechanism can be seen in FIG. 4. The ball bearing 27 itself is connected with the winding drum 15 by means of an adjusting spring 28 in a manner that prevents rotation. The drum surface is equipped with a helix-shaped winding groove 29 for receiving the pulling member 13, which runs approximately tangentially downwards, i.e. it runs directly onto the winding drum 15 and then places itself into the winding groove 29.

A helical guiding element 30 is located on the horizontal shaft 22 at a location removed from the vertical rotation axis A—A. This guiding element is rotated by means of shaft 22 and has the same lead angle as the winding groove 29. This guiding element 30 has a joint effect with the guiding nut 31 in that the part of the pulling member 13 that faces tangentially away from the winding drum 15 is guided in the rotation axis A—A.

In the present case, the helix-shaped guiding element 30 is located on the surface of an extension 15a of the winding drum 15, and the guiding nut 31 is fixed relative to the reference platform 16, i.e. it is connected with the housing 17 by means of screws. As an alternative, it is possible to design the housing 17 and the guiding nut 31 as one part.

The helical guiding element 30 is designed as a guiding groove, and the guiding nut 31 operates by means of rotating balls 32 with the guiding groove.

Due to like thread pitches and the direction of the pitches of the winding groove 29 and the guiding groove 30, depending on the winding up or winding out, the winding drum 15 is always displaced so that the axis of the pulling 13 member is always coaxial to axis A—A and the feed-through opening 15.

In order to bring about a rotating motion of the reference platform 16 with the winding drum 15 around the system axis A—A, an electric gear motor 33 with a hollow shaft 34 is located on the upper side of housing 17 (FIG. 2). This shaft 34 is fixed to the housing 17. The electric connecting lines for controlling and driving the electrical facilities are fed through the hollow shaft 34, however, this is not illustrated in detail here. The connection with outer connections is facilitated by a slip-ring system 35, which again is only illustrated schematically. The stationary part of drive motor 33 is connected through a hoop 36 with the bearing housing 26 which is stationary relative to chamber 2 and the extension 12b. The hoop 36 is routed around the reference platform 16 and/or housing 17 with the drive assembly 23 in such a manner that free movement is facilitated.

Figure 3:
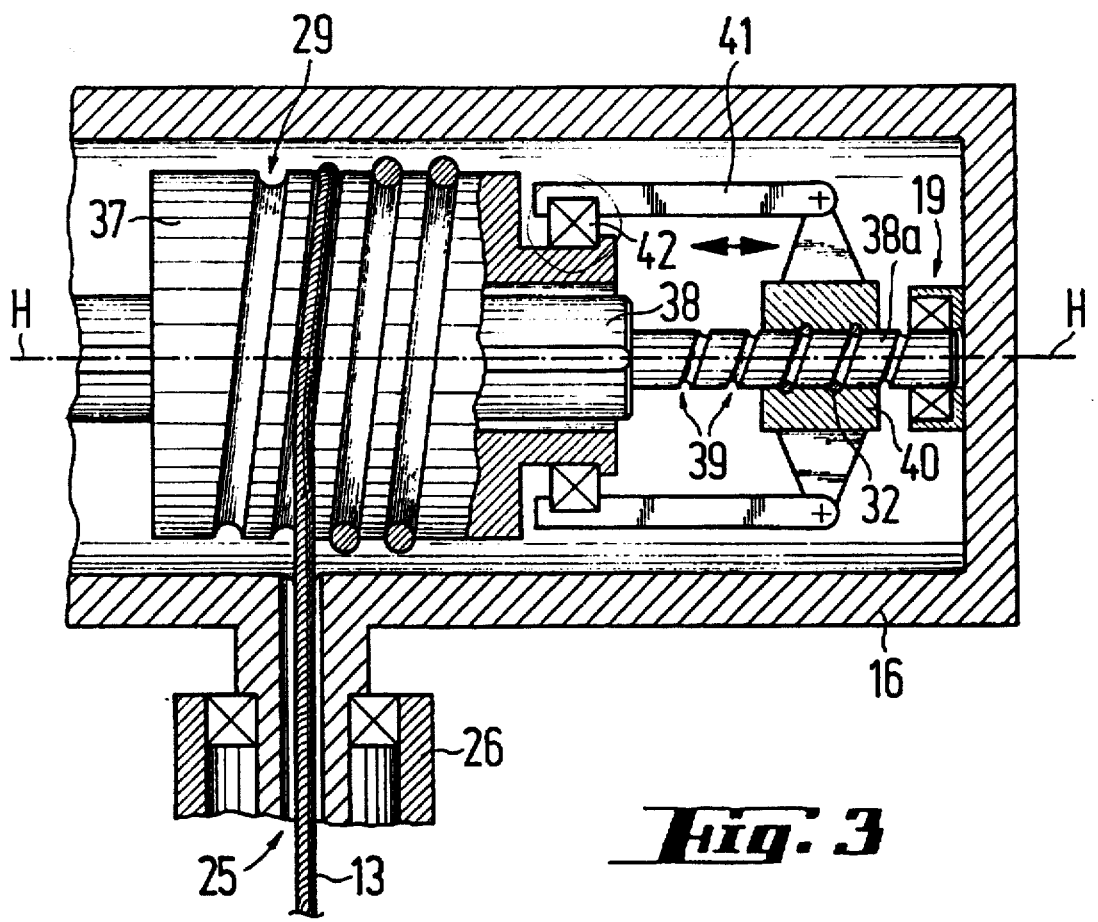
FIG. 3 is a partial section along the horizontal axis H—H through a second embodiment.

In the design option according to FIG. 3, identical parts have been given identical reference symbols as in FIG. 2 so that repetitions are not necessary. In the present case, the winding drum 37 has a shorter design, i.e. it essentially only carries a winding groove 29. The horizontal shaft 38 is designed offset and also carries on its narrower end 38a a helical guide 39 which works together with a guiding nut 40. Although this guiding nut 40 is prevented—by means of mechanisms not illustrated—from rotating vis-a-vis the reference platform 16, it can be displaced axially with the winding drum 37.

The helical guide 39 is also designed as a guiding groove in the present case, and here the guiding nut 40 is connected with the guiding groove by means of rotating balls 32. The helical groove 39 has the same pitch and the same direction as the winding groove 29, so that in this design option, the pulling member 13 is always concentrically guided in the feed-through opening 25 as well. The axial movement of the guiding nut 40 which is present in this case is transmitted by brackets 41 to the winding drum 37 through an axial ball bearing 42. The winding drum 37 is located in an analogous manner on the shaft 38 as is illustrated in FIG. 2.

Figure 4:
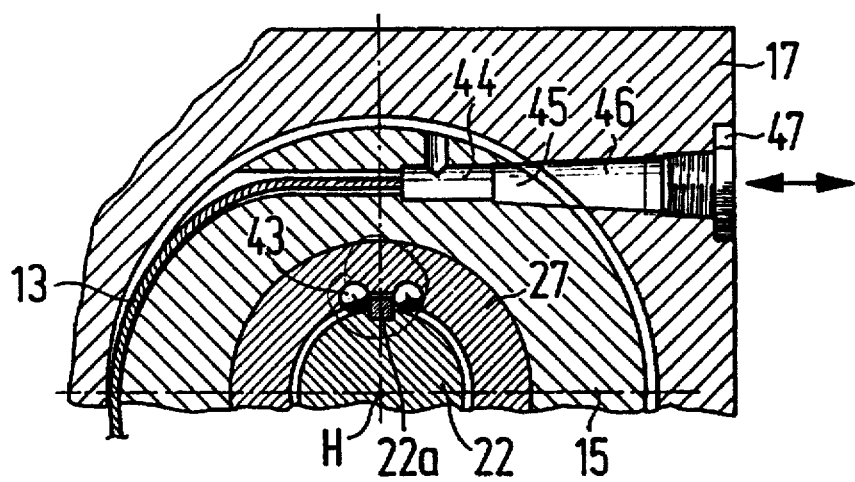
FIG. 4 is an end section through a winding drum in the area of the pulling member.

In FIG. 4, the wedge 22a and balls 43 fix the bearing 27 against rotation relative to shaft 22, but permit relative movement in the axial direction.

Furthermore, the end of the pulling member 13 has an end piece 44 which has a larger diameter, so that this end piece holds the pulling member 13 in a roughly tangential bore 45 of the winding drum 15 and/or 37. An opening 46 that can be closed is located in the housing 17 which is connected with the reference platform 16. This opening is able to align with the end piece 44 of the pulling member 13, and is closed in a gastight manner by means of a screw stopper 47. After taking off the screw stopper 47, the pulling member 13 can be pushed outside through opening 46 where the end piece 44 can be taken off the pulling member 13. In this manner, the pulling member 13 can be taken out of the rotating head without any further disassembly.

Normally, the flexible pulling member 13 is designed as a steel cable made from a temperature and corrosion resistant material. However, it is conceivable to use a chain with fine links or similar means as a pulling member.

We claim:

1. A rotating head for a crystal pulling apparatus, said head comprising a reference platform rotatable about a vertical axis, said platform having a feed-through opening concentric to said axis, a shaft rotatable about a horizontal axis which is fixed relative to said platform, said shaft carrying a drum which is fixed against rotation relative to said shaft but movable axially relative to said shaft, said drum having a helical winding groove for cable means wound on said drum and fed tangentially into said feed-through opening, a helical guide groove concentric to said horizontal axis and rotatable with said shaft, said helical guide groove having the same pitch as said helical winding groove, nut means comprising rotating balls engaging said guide groove to cause axial movement of said nut means relative to said guide groove, one of said guide groove and said nut means being fixed against axial movement relative to said horizontal axis, the other of said guide groove and said nut means being axially fixed relative to said drum, whereby, said drum moves axially along said horizontal axis and said cable means is fed along said vertical axis as said shaft is rotated.

2. Rotating head as in claim 1 wherein said helical guide groove is on said drum remote from said helical winding groove, said nut means being fixed relative to said reference platform.

3. Rotating head as in claim 1 wherein said helical guide groove is on said shaft remote from said drum, said nut means being axially fixed relative to said drum but not rotatable about said horizontal axis.

4. Rotating head as in claim 1 comprising bore means along a chord of said drum, said bore means communicating with said winding groove, an end piece received in said bore means and fixed to said cable means, said end piece being of larger diameter than said cable means, and a housing fixed to said rotatable platform and having an opening which can be aligned with said bore means in said drum.

5. Rotating head as in claim 1 wherein further comprising a drive assembly for said shaft, said drive assembly being located on said reference platform.

* * * * *

UNITED STATES PATENT AND TRADEMARK OFFICE
CERTIFICATE OF CORRECTION

PATENT NO. : 5,702,523
DATED : Dec. 30, 1997
INVENTOR(S) : Schulmann et al.

It is certified that error appears in the above-identified patent and that said Letters Patent is hereby corrected as shown below:

In column 3, line 16, after "crucible" insert -- 3 --.
In column 4, line 31, change "13 member" to -- member 13 --.

Signed and Sealed this

Twenty-ninth Day of August, 2000

Attest:

Q. TODD DICKINSON

Attesting Officer

Director of Patents and Trademarks